(12) United States Patent
Sumida

(10) Patent No.: US 8,850,700 B2
(45) Date of Patent: Oct. 7, 2014

(54) WIRING BOARD AND METHOD FOR MAKING THE SAME

(75) Inventor: Takayuki Sumida, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 1709 days.

(21) Appl. No.: 12/128,238

(22) Filed: May 28, 2008

(65) Prior Publication Data

US 2008/0316722 A1    Dec. 25, 2008

(30) Foreign Application Priority Data

Jun. 19, 2007   (JP) ................. 2007-161428

(51) Int. Cl.
| | |
|---|---|
| H05K 3/02 | (2006.01) |
| H05K 1/16 | (2006.01) |
| H05K 3/24 | (2006.01) |
| H05K 7/06 | (2006.01) |
| H01L 21/48 | (2006.01) |
| H01L 23/498 | (2006.01) |
| H05K 3/06 | (2006.01) |
| H05K 3/12 | (2006.01) |

(52) U.S. Cl.
CPC ........ H05K 3/245 (2013.01); H05K 2201/0969 (2013.01); H05K 3/06 (2013.01); H05K 2201/0391 (2013.01); H05K 2203/0108 (2013.01); H05K 1/16 (2013.01); H05K 2201/2072 (2013.01); H05K 7/06 (2013.01); H05K 3/12 (2013.01); H01L 21/4857 (2013.01); H01L 2924/12044 (2013.01); H01L 23/49822 (2013.01)
USPC ............. 29/846; 29/831; 29/848; 174/250; 174/256; 174/257

(58) Field of Classification Search
USPC ............................ 29/831, 848, 877; 439/74
See application file for complete search history.

(56) References Cited

U.S. PATENT DOCUMENTS

| | | | | |
|---|---|---|---|---|
| 4,837,050 A | * | 6/1989 | Iwasa et al. | 427/97.3 |
| 4,889,961 A | * | 12/1989 | Carlson | 174/261 |
| 5,415,555 A | * | 5/1995 | Sobhani | 439/74 |
| 5,478,971 A | * | 12/1995 | Gotou et al. | 174/250 |
| 5,772,905 A | | 6/1998 | Chou | 16/44 |
| 6,378,199 B1 | * | 4/2002 | Yoshinuma et al. | 29/830 |

(Continued)

OTHER PUBLICATIONS

Xinhong Yu, et al., "Metal Printing with Modified Polymer Bonding Lithography," *Applied Physics Letters*, vol. 88, Jan. 2006, pp. 263517-1-263517-3.

(Continued)

*Primary Examiner* — Tuan T Dinh
*Assistant Examiner* — Steven T Sawyer
(74) *Attorney, Agent, or Firm* — Fitzpatrick, Cella, Harper & Scinto (57) ABSTRACT

A wiring board includes a substrate having an adhesive surface, a first wiring, and a second wiring. The adhesive surface is in contact with the first wiring and the second wiring. The first wiring has a penetrating hole extending in a direction perpendicular to the adhesive surface. The second wiring has a first region, a second region, and a third region, which are adjacent regions arranged in that order. The first region is inside the penetrating hole in the first wiring and in contact with a first portion of the adhesive surface that forms part of the penetrating hole. The second region is in contact with the first wiring and faces the first wiring and the substrate. The third region is in contact with a second portion of the adhesive surface outside the first portion.

15 Claims, 4 Drawing Sheets

(56) References Cited

U.S. PATENT DOCUMENTS

| | | | | |
|---|---|---|---|---|
| 6,792,679 | B1* | 9/2004 | Tai et al. | 29/877 |
| 2002/0121841 | A1* | 9/2002 | Shimoe et al. | 310/313 B |
| 2004/0221450 | A1* | 11/2004 | Sinha | 29/852 |
| 2005/0044702 | A1* | 3/2005 | Shaeffer et al. | 29/830 |
| 2005/0208789 | A1* | 9/2005 | Shirai et al. | 439/66 |

OTHER PUBLICATIONS

Zhe Wang, et al., "Metal Transfer Printing and Its Application in Organic Field Effect Transistor Fabrication," *Advanced Materials*, vol. 15, No. 12, Jun. 2003, pp. 1009-1012.

\* cited by examiner

WIRING BOARD AND METHOD FOR MAKING THE SAME

BACKGROUND OF THE INVENTION

1. Field of the Invention

The present invention relates to micro wiring boards used in semiconductor devices or semiconductor integrated circuits and to methods for making the micro wiring boards. In particular, it relates to a micro wiring board made by a transfer printing technique and to a method for making the micro wiring board.

2. Description of the Related Art

A transfer imprinting technique, unlike its original embossing nanoimprinting technique, is an additive process that does not require a process of etching the resist after transfer.

U.S. Pat. No. 5,772,905 teaches a transfer printing method in which gold is vapor-deposited on a polydimethylsiloxane (PDMS) mold having a protruding feature and activated by oxygen plasma treatment, and then the mold is pressed against a substrate to transfer gold. The patent document also discloses formation of a semiconductor circuit by bonding a plurality of substrates each preliminarily provided with a pattern thereon. This semiconductor circuit operates as an inverter.

In "Metal Transfer Printing and Its Application in Organic Field-Effect Transistor Fabrication" by Z. Wang, J. Yuan, J. Zhang, R. Xing, D. Yan, and Y. Han, Advanced Materials, 15, 1009 (2003), a transfer method in which gold is deposited on a mold composed of PDMS and then the mold with gold is pressed against a polymer-coated silicon substrate to transfer gold is disclosed. The transfer is carried out by heating the substrate at a temperature not less than the glass transition temperature of the polymer so that the adhesiveness of the polymer is increased to facilitate transfer. This document also discloses an example in which wirings are stacked on the same substrate. That is, after transferring a gold line pattern (first layer) having a line width of 50 μm on a substrate, another gold line pattern (second layer) having a line width of 50 μm is formed on the first layer gold line pattern so that the pattern of the first layer and the pattern of the second layer are orthogonal to each other. The document also discloses that the gold line pattern of the second layer is adequately bonded and supported because the area of contact between the gold line pattern of the second layer and the polymer portion outside the gold line pattern of the first layer is sufficiently large.

In "Metal printing with modified polymer bonding lithography" written by Xinhong Yu, Shunyang Yu, Zhe Wang, Dongge Ma, and Yanchum Han, Applied Physics Letters, 88, 263517 (2006), a process of transferring a metal pattern onto a polymer is disclosed. In this process, a PDMS mold is used and transfer is carried out by utilizing the lowering of the glass transition point of the polymer exposed to the solvent vapor.

As described above, micron- to submicron-order electrode wirings have been formed by the transfer printing technique.

However, the transfer printing technique has the following drawbacks in fabricating large-scale circuits. In general, most adhesive layers used for transfer have insulating properties. Thus, in forming interconnections between pads necessary for circuit wiring and metal-metal junctions necessary for vias, conduction between the first metal pattern and the second metal pattern cannot be ensured because the second metal pattern is transferred on the insulating adhesive layer on the first metal pattern. Even when a conductive adhesive is used, it is difficult to form an adhesive layer at a specified position on a nano-level due to limited alignment accuracy.

As disclosed in Advanced Materials, 15, 1009 (2003), in the case where a polymer on a substrate surface outside the first metal pattern region is used as an adhesive layer, the contact area between the overlying metal pattern and the polymer is small. Thus, in the case where a transistor having a line width or an interline space smaller than about 50 μm is to be fabricated to satisfy the needs for higher density wiring or a shorter transistor channel length, it is difficult to stably fix the overlying metal pattern. Moreover, since the adhesive layer must be provided in a region outside the wiring region, it is difficult to increase the wiring density. Furthermore, in the case where patterns are bonded in the height direction only, such as when a via or a laminate is to be formed, the patterns in the second and higher layers lose contact with the adhesive portion. Thus, the patterns cannot be bonded.

Another problem arises when the transfer printing technique is combined with another drawing process such as ink jet printing or screen printing. The problem is wetting of ink on metal patterns. The wettability of the wiring to the ink decreases further if the releasing agent applied on the mold in advance remains on the wiring after transfer. The remaining releasing agent may be removed by an appropriate process such as UV-ozone processing, but damage inflicted on the organic substrate by this process is considerable. Moreover, the film thickness of the wiring formed by ink jet printing or screen printing is large, which renders it difficult to apply the transfer printing technique.

SUMMARY OF THE INVENTION

The present invention provides a wiring board in which micro wirings are connected to each other and a method for making the wiring board. In particular, interconnections between pads necessary for circuit wiring and metal-metal junctions required for vias can be formed by forming micro wirings by a transfer technique.

According to one aspect, a wiring board includes a substrate having an adhesive surface, a first wiring, and a second wiring. The adhesive surface is in contact with the first wiring and the second wiring. The first wiring has a penetrating hole extending in a direction perpendicular to the adhesive surface. The second wiring has a first region, a second region, and a third region, which are adjacent regions arranged in that order. The first region is inside the penetrating hole in the first wiring and in contact with a first portion of the adhesive surface that forms part of the penetrating hole. The second region is in contact with the first wiring and faces the first wiring and the substrate. The third region is in contact with a second portion of the adhesive surface outside the first portion.

The substrate can have a multilayer structure including a plurality of layers, and the outermost layer of the multilayer structure may be an adhesive layer. Furthermore, among the segments that can exist in the penetrating hole, the longest segment parallel to the width of the first wiring may have a length of 10% or more but 90% or less of the width of the first wiring.

Another aspect provides a method for making a wiring board. The method includes a step of applying a first conductive material on at least a protruding feature of a first mold that has protruding and recessed features; a step of forming a first wiring by pressing the first mold against an adhesive surface of a substrate so as to transfer the first conductive material on the protruding feature onto the adhesive surface of the substrate, the first wiring having a penetrating hole extending in a direction perpendicular to the adhesive surface; and a step of forming a second wiring by applying a second conductive material onto a surface of the first wiring, a first portion of the adhesive surface that forms part of the penetrating hole in the first wiring, and a second portion of the adhesive surface near the penetrating hole but outside the first portion.

The step of forming the second wiring may include applying the second conductive material on a protruding feature of a second mold having protruding and recessed features; and pressing the second mold against the substrate so as to transfer the second conductive material on the surface of the first wiring, the first portion, and the second portion. The step of forming the second wiring may be carried out by any one of an ink jet printing process, a screen printing process, and an offset printing process. The first wiring may be transferred onto the substrate by a nanoimprinting process or a soft lithographic process.

Further features of the present invention will become apparent from the following description of exemplary embodiments with reference to the attached drawings.

BRIEF DESCRIPTION OF THE DRAWINGS

FIG. 3A-1 is a schematic view of the first wirings, FIGS. 3B-1 to 3B-3 are cross-sectional views of junctions of the first and second wirings, FIG. 3C-1 is a schematic view of first wirings without penetrating holes, and FIGS. 3D-1 to 3D-3 are cross-sectional views of junctions of the first and second wirings.

DESCRIPTION OF THE EMBODIMENTS

According to an embodiment, a wiring board includes a substrate having an adhesive surface, a first wiring, and a second wiring. The adhesive surface is in contact with the first wiring and the second wiring. The first wiring has a penetrating hole extending in a direction perpendicular to the adhesive surface. The second wiring has a first region, a second region, and a third region, which are adjacent regions arranged in that order. The first region is inside the penetrating hole in the first wiring and in contact with a first portion of the adhesive surface that forms part of the penetrating hole. The second region is in contact with the first wiring and faces the first wiring and the substrate. The third region is in contact with a second portion of the adhesive surface outside the first portion.

Figure 3A:
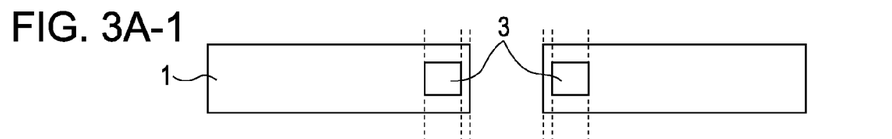

The elements constituting the wiring board will now be described in detail with reference to FIGS. 3A-1 to 3D-3. FIG. 3A-1 is a schematic view showing an example of the first wirings. FIGS. 3B-1 to 3B-3 are diagrams showing the steps for forming an example of the wiring board.

As shown in FIG. 3B-3, the wiring board includes a substrate 5, first wirings 1, and a second wiring 4. The substrate 5 functions as a supporting member for the wirings and has an adhesive surface 8.

Figure 3B:
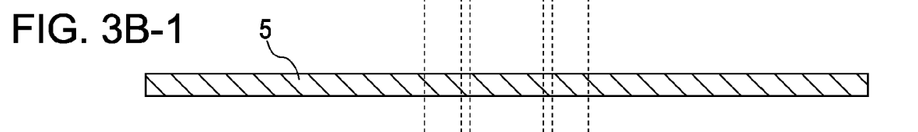
Figure 3B:
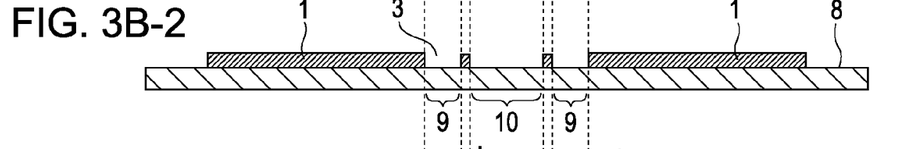
Figure 3B:
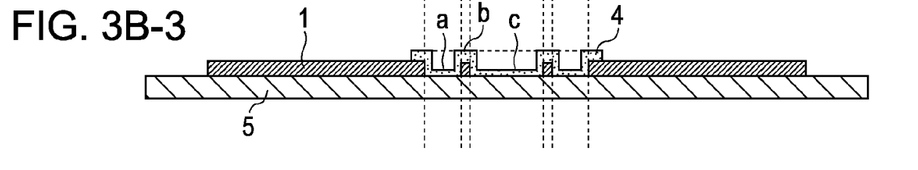
Figure 3C:
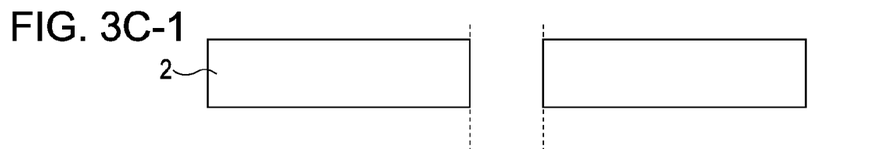
Figure 3D:
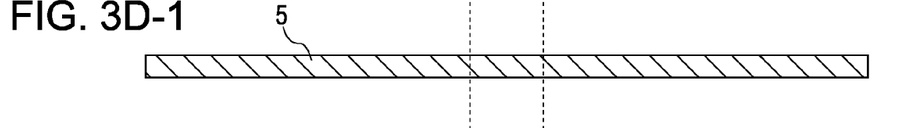
Figure 3D:
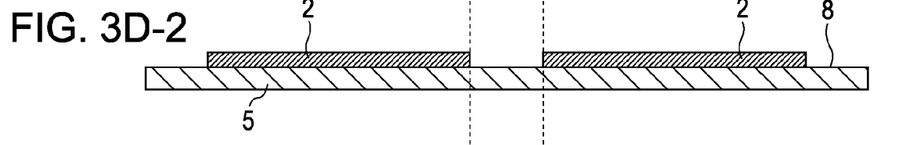
Figure 3D:
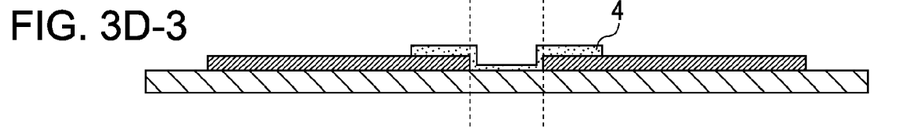

The substrate 5 may be made of one layer or may have a multilayer structure including two or more layers as long as the surface has adhesiveness. The first wirings 1 can satisfactorily adhere onto the substrate 5 because the surface of the substrate 5 has adhesiveness. When the substrate 5 is made of one layer, the adhesive layer is the substrate 5 itself. When the substrate 5 has a multilayer structure, the outermost layer on which the first wirings 1 and the second wiring 4 are formed needs to serve as an adhesive layer but other layers need not have adhesiveness. In this specification, the term "adhesive layer" refers to a layer that has adhesiveness or that potentially has adhesiveness. Accordingly, an adhesive layer may be a layer that has adhesiveness without having to undergo a particular process such as heating or UV irradiation or may be a layer that exhibits adhesiveness after being subjected to a process such as heating or UV irradiation. Moreover, in this specification, the term "adhere" refers to a state in which one surface is chemically and/or physically bonded to another surface via an adhesive layer composed of a material that adheres onto an adherend by application of a small pressure.

Examples of the material that forms an adhesive layer that exhibits adhesiveness without having to undergo a process such as heating, UV irradiation, or the like include vinyl acetate resins, phenolic resins, vinyl alcohol resins, acrylic resins, olefin resins, urethane resins, epoxy resins, silicone resins, and polyvinyl naphthalene resins. Examples of the material of an adhesive layer that exhibits adhesiveness after a process such as heating, UV irradiation, or the like include thermoplastic resins and thermosetting resins such as styrene resins and methyl methacrylate resins. In this specification, the notation "vinyl acetate resins" is used to refer to resins composed of polyvinyl acetate and resins composed of vinyl acetate derivatives. The same applies for any other resins.

In the case where the substrate 5 has a multilayer structure, the multilayer structure may be prepared by an application technique such as spin coating, or a transfer technique. Layers other than the adhesive outermost layer may each be composed of an appropriate material such as a silicon wafer, glass, a metal, or a resin.

At least part of each first wiring 1 and at least part of the second wiring 4 adhere to the adhesive surface 8. The first wiring 1 has at least one penetrating hole 3 shown in FIG. 3A-1, and thus the area of contact between the second wiring 4 overlying the first wirings 1 and the adhesive surface 8 of the substrate 5 is sufficiently large. According to this structure, the second wiring 4 is tightly fixed on the substrate 5 while making satisfactory contact with the first wirings 1. Each penetrating hole, or opening, 3 extends in a direction perpendicular to the adhesive surface 8, that is, the penetrating hole 3 extends from the surface of the first wiring 1 that contacts the adhesive surface 8 to the opposite surface of the first wiring 1 remote from the adhesive surface 8. In other words, some portions of the adhesive surface 8 of the substrate 5 are part of the penetrating holes 3 in the first wirings 1.

The penetrating holes 3 may have any shape as long as they are in the first wirings 1. For example, the penetrating holes 3 may have a square pillared shape shown in FIG. 3A-1, a cylindrical shape, or a triangular pillared shape.

As for the size of the penetrating holes 3, among the segments that can exist inside the penetrating hole 3, the longest segment parallel to the width of the first wiring 1 may have a length of 10% or more but 90% or less of the width of the first wiring 1. This is because if the penetrating hole 3 is oversized, the area of the first wiring 1 between the outer edge of the first wiring 1 and the penetrating hole 3 becomes small although the contact area between the second wiring 4 and the adhesive surface 8 increases. Accordingly, the lines may break during transfer of the first wiring 1.

The first wirings 1 and the second wiring 4 are composed of conductive materials. Examples of the conductive materials include metals such as gold, silver, copper, and aluminum, alloys thereof, and conductive polymers.

As shown in FIG. 3B-3, the second wiring 4 has three contiguous regions, i.e., a first region a, a second region b, and a third region c, which are adjacent regions arranged in that order. In this specification, the notation such as "a, b, and c are adjacent regions arranged in that order" means that a, b, and c are aligned in that order so that a is in contact with b and b is in contact with c. The first region a of the second wiring 4 is inside the penetrating hole 3 in the first wiring 1 and is in contact with the adhesive surface 8 of the substrate 5 inside the penetrating hole 3. The second region b is in contact with the first region a and with the first wiring 1. The second region b opposes the substrate 5 with the first wiring 1 in between. In other words, the second region b is a region in contact with the region that exits between the outer edge of the first wiring 1 and the penetrating hole 3.

The third region c is in contact with the second region b and with the adhesive surface 8 of the substrate 5 at least partly. Since the second wiring 4 contacts the adhesive surface 8 not only in the third region c but also in the first region a, the second wiring 4 is tightly affixed on the substrate 5.

A method for making the wiring board will now be described. The method for making a wiring board includes the following steps:

1) a step of applying a first conductive material on at least a protruding feature of a first mold that has protruding and recessed features;
2) a step of forming a first wiring by pressing the first mold against an adhesive surface of a substrate so as to transfer the first conductive material on the protruding feature onto the adhesive surface of the substrate, the first wiring having a penetrating hole extending in a direction perpendicular to the adhesive surface; and
3) a step of forming a second wiring by applying a second conductive material on a surface of the first wiring, a first portion of the adhesive surface that forms part of the penetrating hole in the first wiring, and a second portion of the adhesive surface near the penetrating hole but outside the first portion.

Each of the steps will now be described with reference to FIGS. 3A-1 to 3D-3.

Step 1

The first wirings 1 are formed by a transfer printing technique using a mold. In particular, a patterned mold having a protruding feature and coated with a material to be transferred is pressed against an adhesive surface of a substrate to transfer the material coating the protruding feature onto the substrate. Examples of such a transfer printing technique include a nanoimprinting technique and a soft lithographic technique.

The first mold has a patterned surface with protrusions and recesses for transferring the first wiring material onto the substrate. The pattern may be any appropriate pattern. However, the pattern for forming the first wiring 1 should at least be capable of forming a penetrating hole 3 within the wiring width. In order to align part of the second wiring to the penetrating hole 3 of the first wiring 1, alignment marks may be formed. Considering the degree of defect during transfer, the pattern width may be 10 μm or less and the pattern length may be 100 times the pattern width or less. The width and the length of the protruding feature of the mold may be approximately the same as those of the wiring to be formed.

The protruding and recessed features of the mold may be formed by an electron beam lithography technique or a photolithographic technique that uses common photosensitive resist materials. The material constituting the mold may be any appropriate material that can maintain the protruding and recessed pattern during the transfer step. In general, the mold is composed of a metal material such as silicon, quarts, or nickel, or a polymer material such as polydimethylsiloxane (PDMS). Silicon is favored since lithography can be easily performed and the technology therefor is established.

In applying a wiring material onto the mold, a releasing agent may be applied onto the mold in advance before the wiring material is applied. The releasing agent may be a fluorine-based or silicone-based releasing agent commercially available. Since the feature size is as small as on micron to submicron order, it is preferable to use an agent whose molecules exhibit a releasing property by forming an ultra thin film, such as a fluorine-terminated silane coupling agent, in order to prevent clogging of the recessed portion. Moreover, in the case where a fluorine-based polymer or the like is used as the material of the mold, the mold itself has a releasing property and therefore coating with a releasing agent is not needed. Whether application of the releasing agent is necessary may be determined by the combination of the mold material and the material to be transferred. For example, in the case where the mold is a quartz mold and the material to be transferred is aluminum, aluminum strongly adheres on the mold and transfer of aluminum is impossible. Thus, a releasing agent must be applied onto the mold in advance. In the case where the mold is a quartz mold and the material to be transferred is gold, transfer is possible without a releasing agent but the performance is not satisfactory. Thus, a releasing agent may be coated to achieve effective transfer.

The coating method for coating a mold with a thin film of the material to be transferred may be adequately selected according to the material. For example, an application method such as a vacuum vapor deposition method, a spin coating method, or a dipping method may be selected. In the case where an application method is used, wirings can be formed from a dispersion or paste of metal nanoparticles. For example, a homogeneous film can be easily formed by employing a vacuum vapor deposition method.

Step 2

The first mold covered with a thin film of the first conductive material prepared as above is arranged to oppose the substrate 5 shown in FIG. 3B-1. The first mold is then brought into contact with and pressed against the substrate 5, and then separated from the substrate 5. As a result, the thin film composed of the material for the first conductive material is transferred from the first mold onto the substrate 5, thereby forming the first wirings 1 having the penetrating holes 3 as shown in FIGS. 3A-1 and 3B-2. During or between these steps, a heating or cooling step may be provided depending on the adhesion conditions of the adhesive surface of the substrate or in order to allow the substrate to develop adhesiveness. If an insulating releasing agent is used in this step, an additional process of removing the residue of the releasing agent existent on the surface of the first wirings may be provided.

Step 3

A second conductive material is then provided to form the second wiring 4 over the surface of the first wirings 1 formed by Steps 1 and 2 shown in FIG. 3B-2, and over portions 9 of the adhesive surface 8 of the substrate 5 that serve as part of the penetrating holes 3 of the first wirings 1, and a portion 10 of the adhesive surface 8 near the penetrating holes 3 but outside the portions 9 that form part of the penetrating holes 3. As a result, a wiring board shown in FIG. 3B-3 is formed.

It should be noted here that the term "near" means that the concerned part is not more than the diameter of the penetrating hole 3 away from the penetrating hole 3. According to this method, the second wiring 4 is in contact with the portions 9 and 10 of the adhesive surface 8. Thus, the second wiring 4 can be stably fixed to the first wiring 1, and the contact between the first wiring 1 and the second wiring 4 can be satisfactorily maintained.

The second wiring 4 may be formed by any suitable method that can form the second wiring 4 on the surface of the first wiring 1 and on the portions 9 and 10 of the adhesive surface 8 of the substrate 5. For example, as in the case of forming the first wiring 1, the second conductive material may be provided to a second mold and then be transferred onto the substrate (transfer printing technique). Alternatively, a printing method using ink, such as an ink jet printing method, a screen printing method, or an off-set printing method, may be employed.

EXAMPLES

Example 1

Example 1 shows that formation of penetrating holes in the wiring can improve transferability and ensure electrical conduction.

Figure 1:
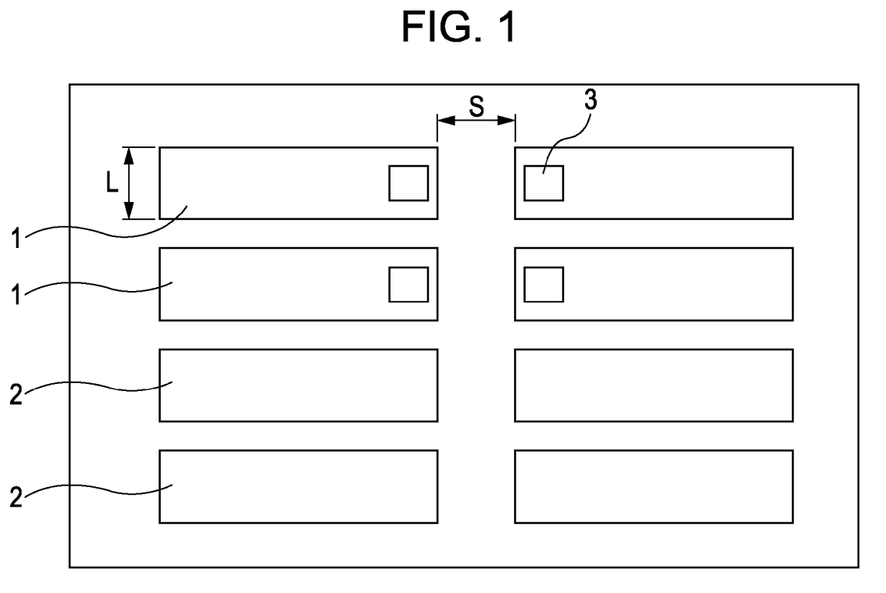
FIG. 1 is a schematic view of a mold pattern for first wirings.
Figure 2:
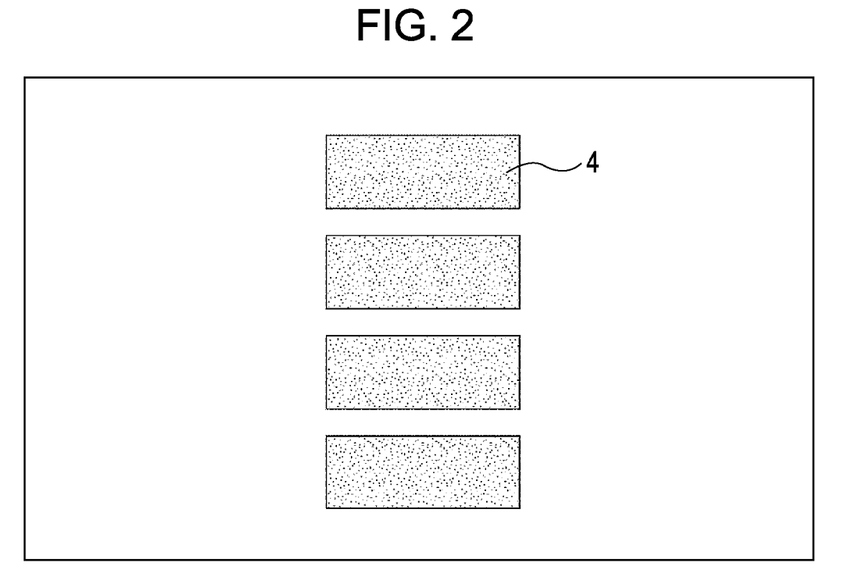
FIG. 2 is a schematic view of a mold pattern for second wirings.

FIG. 1 is a schematic view of a mold pattern for transferring first wirings with penetrating holes. FIG. 2 is a schematic view of a mold pattern for transferring second wirings. Each view shows a state in which the material to be transferred is already applied. How the penetrating holes in the first wirings affected the success of transfer operation in transferring the second wirings onto the first wirings having a line width (L) and an interline space (S) was examined.

First, a silicon wafer with a thermally oxidized film (oxide film thickness: 200 nm) was subjected to electron beam lithography and then to dry etching with reactive ions to form a mold having protruding and recessed features. The mold was immersed in OPTOOL DSX (produced by Daikin Industries, Ltd.) diluted 1:1000, and then placed in a steam bath for 1 hour at 75° C. to impart releasing property to the mold surface. Gold was vapor-deposited on the mold to make a gold-coated mold. The thickness of the gold thin film deposited was 50 nm. The thickness was adjusted to 50 nm because an excessively large thickness may cause gold in the recessed part of the mold to be transferred to the substrate upon pressing since the depth of the mold pattern was 200 nm.

A silicon wafer (18 mm×17 mm quadrangle) with a thermally oxidized film on which a poly-2-vinylnaphthalene layer was spin-coated was selected as a substrate. The thickness of the poly-2-vinylnaphthalene layer was 30 nm. The mold was pressed against the substrate to transfer gold coating the mold and to thereby form first wirings. As for the transfer conditions, the mold was pressed against the substrate at 5 kN for 5 minutes while heating the substrate at 60° C., then the substrate was cooled to 30° C., and the pressure was released.

Figure 4:
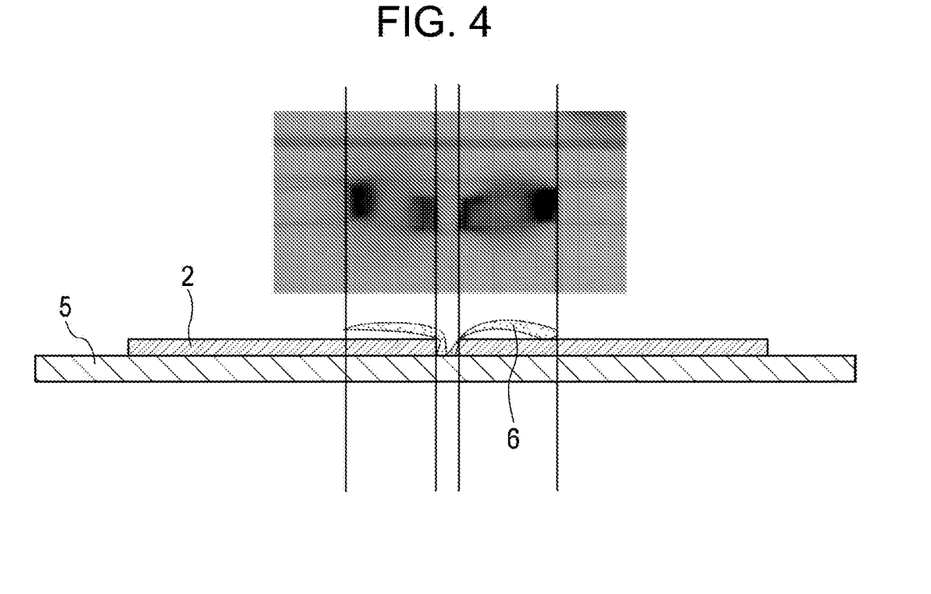
FIG. 4 includes a cross-sectional view of wirings in a separated state and a corresponding micrograph.

The same process was conducted using a mold for forming the second wirings to establish interconnections. The transferred micro wirings appropriately connected to each other are shown in FIG. 3B-3 and 3D-3. FIG. 3B-3 shows a wiring board with penetrating holes in the first wirings and FIG. 3D-3 shows a wiring board without penetrating holes in the first wirings. FIGS. 3D-1 to 3D-3 are diagrams showing the process of making a wiring board including first wirings without penetrating holes. FIG. 3C-1 is a diagram showing first wirings without penetrating holes. As shown in a micrograph and diagram of FIG. 4, if interconnections are not properly established, a second wiring 6 separates from the substrate 5 and first wirings 2 having no penetrating holes, and the structure becomes unstable and defective.

Table 1 summarizes the defect rates (%), i.e., occurrence of separation, at various interline spaces (S), when the line width (L) is 10 μm and 5 μm-square penetrating holes are provided. A wiring was assumed to be defective if it failed to exhibit conductivity in the conduction test described below. The number of wirings that failed to conduct was counted, and the defect rate was determined by dividing the number of defective wirings by the total number of wirings.

TABLE 1

| S | 20 μm | 10 μm | 5 μm | 1 μm |
|---|---|---|---|---|
| With holes | 7 | 13 | 12 | 16 |
| Without holes | 16 | 21 | 25 | 32 |

As shown in Table 1, the defect rate increased as the interline space decreased in the wirings not provided with penetrating holes. In contrast, in the wirings provided with penetrating holes, the defect rate decreased with the interline space. The defect rate of the wirings not provided with penetrating holes decreased presumably because the area of contact between the second wiring and the adhesive layer that fixed the second wiring decreased with the interline space. In contrast, in the wirings provided with penetrating holes, the area of contact between the second wiring and the adhesive layer that fixed the second wiring was sufficient due to the presence of the penetrating holes. Thus, the defect rate did not increase.

The electrical conductivity was measured by forming a pair of first wirings facing each other with an interline space therebetween and bringing probes into contact with an area within 100 μm from the edge of one of the first wiring and an area within 100 μm from the edge of the other first wiring to examine whether the current was carried. Here, "edge" means an edge most distant from the interline space among all edges of the first wiring.

As a result of the conduction test, wirings with no defect were also confirmed as having conductivity and had a resistivity ($\rho$) of 4.9E-08 $\Omega$m. This resistivity is close to the bulk resistivity of gold, which is 2.4E-08 $\Omega$m. Thus, it was confirmed that interconnections between wirings were satisfactorily established.

As demonstrated in Example 1, formation of penetrating holes can decrease the defect rate that otherwise increases by reduction of wiring space and an increase in density. Thus, wirings can be satisfactorily connected to each other while maintaining a satisfactory electrical contact.

Example 2

Example 2 is an example that uses a resin substrate as the substrate onto which transfer is conducted.

In this example, a polyethylene naphthalate film (Teonex (trade name) film produced by Teijin DuPont Films) was used as the resin substrate. Other experimental procedures were the same as those in Example 1 except that coating with the resin adhesive layer was not provided. The transfer was conducted by pressing a mold against the polyethylene naphthalate film at a pressure of 5 kN for 5 minutes while heating the substrate at 150° C., cooling the substrate to 30° C., and releasing the pressure. The line width (L) was 10 μm, the space (S) was 10 μm, and the penetrating hole was square-shaped with a 5 μm side.

The results showed that as with the case of Example 1 in which the poly-2-vinylnaphthalene layer was coated as a resin adhesive layer, the defect rate improved when wirings had penetrating holes. In particular, the defect rate was 16% for wirings with penetrating holes and 24% for wirings without penetrating holes.

Example 2 shows that the resin substrate heated to the glass transition point or higher serves as an adhesive layer, and thus the penetrating holes contribute to the reduction of defect rate.

Example 3

In Example 3, a silicon wafer with a thermally oxidized film was used as a substrate, and the effects of various resin layers spin-coated on the substrate on the defect rate of wiring interconnection were compared. The resins coated were poly-2-vinylnaphthalene (PVN), methyl silsesquioxane (MSQ), polymethyl methacrylate (PMMA), polystyrene (PS), polyimide (PI), and polyvinyl phenol (PVP). The thickness of each resin layer was adjusted to be about 30 nm. The first mold was pressed against the substrate to transfer gold coated on the first mold to thereby form the first wirings. Then, the second mold was pressed against the substrate having the first wirings thereon to transfer gold coating the second mold to thereby form a second wiring. As for the transfer conditions, the mold was pressed against the substrate at a pressure of 5 kN for 5 minutes while heating the substrate at 100° C. and the pressure was released after the substrate was cooled to 30° C. The defect rates are summarized in Table 2. The line width (L) was 10 μm, the space (S) was 10 mm, and the penetrating hole was square in shape with a 5 μm side.

TABLE 2

|  | With holes | Without holes |
|---|---|---|
| No resin coating | 100 | 100 |
| PVN | 14 | 23 |
| MSQ | 52 | 62 |
| PMMA | 16 | 25 |
| PS | 19 | 27 |
| PI | 57 | 61 |
| PVP | 49 | 54 |

The defect rate was 100% when the thermal oxide film surface was not coated with a resin. This was because the first wiring could not be transferred the non-adhesive surface of the substrate. In contrast, when substrates respectively coated with PVN, PMMA, and PS were used, the first wiring was satisfactorily transferred, and the defect rate significantly improved due to the presence of the penetrating holes.

Example 4

In Example 4, a wiring was drawn on the transferred first wiring by using an ink for printing. A silicon wafer with a thermally oxidized film spin-coated with a polyvinyl alcohol (PVA) layer was used as the substrate. The thickness of the polyvinyl alcohol layer was about 100 nm. The ink was an aqueous dispersion of silver nanoparticles. As in Example 1, the first wirings had a line width of 10 μm, an interline space of 10 μm, and 5 μm-square penetrating holes. Ink droplets were applied by an ink jet printing technique so as to fill the interline space. The conduction test was performed between the wirings to determine whether conduction was achieved and to evaluate the conductivity.

When the printing technique was used, separation caused by lack of adhesiveness observed in Example 1 was not observed; however, wettability of the first wiring to the ink posed a problem. In the case where no penetrating holes were provided, PVA showed good wettability to the ink provided between the interline space but the first wiring repelled the ink provided thereon. The conductivity was low, i.e., 45%. The gold wiring surface formed by transfer was analyzed by time-of-flight secondary ion mass spectrometry (TOF-SIMS) and presence of carbon fluoride was confirmed. Carbon fluoride was derived from the releasing agent coating the mold surface and caused degradation of ink wettability.

In the wirings with penetrating holes, the ink wetted the penetrating holes and the interline space. The ink also wetted the space from the edge of the penetrating hole to the outer edge of the first wiring, thereby improving the conductivity to 70%. Example 4 shows that presence of penetrating holes helps establish interconnection between wires in the process using an ink and a wiring board prepared by a transfer technique.

Example 5

Figure 5:
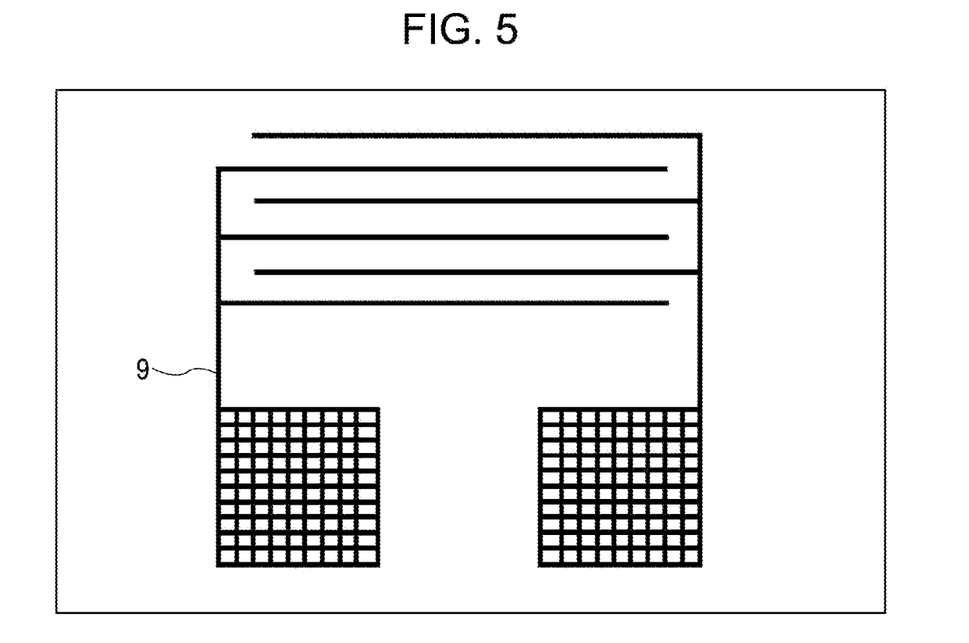
FIG. 5 is a schematic view showing a mold pattern of source/drain electrodes.

In Example 5, first wirings were transferred while using the resin adhesive layer with improved transferability described in Example 3, and thin film transistors were made using the transferred first wirings as electrodes. The transistors were then connected to each other with a second wiring. A silicon wafer with a thermally oxidized film (the oxide film serving as the gate insulating film was a $SiO_2$ layer having a thickness of 500 nm) on which a poly-2-vinylnaphthalene layer 30 nm in thickness was spin-coated was selected as a substrate. A mold 7 having an interdigital pattern shown in FIG. 5 was used to transfer the first wirings (source and drain electrodes) onto the substrate under the same conditions as Example 1.

Figure 6:
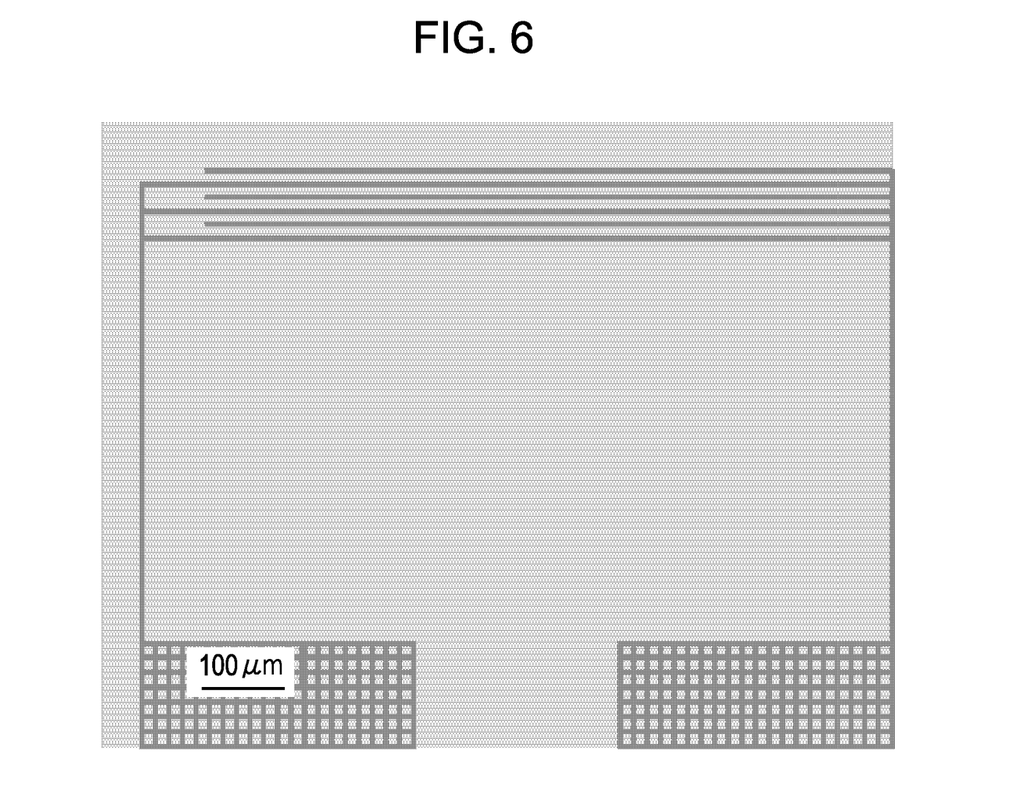
FIG. 6 is a schematic view showing transferred source/drain electrodes.

As for the parameters of the source and drain electrodes, the channel lengths were 5 μm, 10 μm, 20 μm, and 40 μm, and the channel width was fixed to 500 μm. A micrographic image of the electrodes formed by transfer with a channel length of 5 μm is shown in FIG. 6. As shown in FIG. 6, the pattern reflecting the pattern on the mold was transferred.

A 200 μm-square grid pattern with a line width of 5 μm and a line space of 5 μm was used to form the first wiring. It is possible to first form a solid pattern by transfer and then form penetrating holes in the solid pattern. However, in this example, lines having a width of 5 μm, which had excellent transferability, were arranged into a grid, and the grid was used as the electrode pad to improve transferability.

Each grid pattern can also be regarded as a wiring that includes many penetrating holes. Thus, this pattern is preferable in transferring another wiring over the wiring already transferred.

After transferring the wirings, an organic semiconductor, pentacene, was vacuum-vapor-deposited only on upper part of the interdigital electrodes through a mask so as to form an active layer of the transistor. The substrate temperature during the deposition was 75° C. The characteristics of the transistors obtained as a result are shown in Table 3. Either of the grid-shaped pads may be used as a source or drain electrode. In this example, the left pad was used as the drain electrode and the right pad was used as the source electrode.

TABLE 3

|  |  | Channel length/μm | | | |
| --- | --- | --- | --- | --- | --- |
|  |  | 5 | 10 | 20 | 40 |
| Mobility | cm²/Vs | 0.22 | 0.18 | 0.20 | 0.25 |
| ON/OFF ratio |  | 940 | 2200 | 3200 | 4200 |
| Threshold voltage | V | −15.5 | −14.3 | −16.7 | −16.0 |

According to Table 3, the mobility and the threshold voltage were substantially the same irrespective of channel length. The average mobility was 0.21 cm²/Vs ($\sigma$=0.03), and the average threshold voltage was −15.6 V ($\sigma$=1.0). In contrast, the ON/OFF ratio decreased with the channel length. This is because off-leak current between the source and drain electrodes increases as the channel length decreases.

In Example 5, PVN was used as an adhesive resin layer. It is known that PVN serves as an adhesive resin layer and also as a surface-treating layer for the organic semiconductors. Accordingly, when the source/drain electrodes are transferred on the adhesive resin layer, the part of the adhesive layer, i.e., the surface-treating layer, exposed between the electrodes functions as a channel. Thus, the characteristics of the organic semiconductors are improved. In other words, when a resin having both adhesiveness and a surface-treating effect is selected and the transfer process of the present example not using any organic solvent in etching is employed, transistor characteristics with in-plane homogeneity can be achieved.

The transistors were then connected to each other. Two grid-shaped pads respectively belonging to a transistor having a 10 μm channel length and a transistor having a 20 μm channel length next to each other were connected to each other with a wiring (second wiring) having a width of 10 μm under the same transfer conditions as that for making the transistor. The characteristics of each transistor were measured by using the interconnecting wiring as the common source electrode. The results satisfactorily showed that the characteristics were the same as when they were individually measured.

In other words, Example 5 shows that in the case where transistors are made by using first wirings, it is possible to start the transistors by connecting the first wirings with the second wiring.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-161428 filed Jun. 19, 2007, which is hereby incorporated by reference herein in its entirety.

What is claimed is:

1. A method for making a wiring board, comprising:
a step of applying a first conductive material on at least a protruding feature of a first mold that has protruding and recessed features;
a step of forming a plurality of first wirings as electrodes of a transistor by pressing the first mold against an adhesive surface of a substrate so as to transfer the first conductive material on the protruding feature onto the adhesive surface of the substrate, the plurality of first wirings having a penetrating hole extending in a direction perpendicular to the adhesive surface;
a step of forming an active layer of the transistor by applying an organic semiconductor on the plurality of first wirings; and
a step of forming a second wiring by applying a second conductive material on a surface of the plurality of first wirings, a first portion of the adhesive surface that forms part of the penetrating hole in the plurality of first wirings, and a second portion of the adhesive surface near the penetrating hole but outside the first portion,
wherein, among segments of the second wiring that can exist inside the penetrating hole, the longest segment parallel to a width of the plurality of first wirings has a length of 10% or more but 90% or less of the width of the plurality of first wirings,
wherein the substrate includes an adhesive layer whose surface is the adhesive surface,
wherein the adhesive layer consists essentially of poly-2-vinylnaphthalene, and
wherein the active layer and the adhesive layer contact each other between the plurality of first wirings.

2. The method according to claim 1, wherein the step of forming the second wiring includes:
applying the second conductive material on a protruding feature of a second mold having protruding and recessed features; and
pressing the second mold against the substrate so as to transfer the second conductive material onto the surface of the first wiring, the first portion, and the second portion.

3. The method according to claim 1, wherein the step of forming the second wiring is carried out by any one of an ink jet printing process, a screen printing process, and an offset printing process.

4. The method according to claim 1, wherein the first wirings are transferred onto the substrate by a nanoimprinting process or a soft lithographic process.

5. The method according to claim 1, wherein the first portion is surrounded by the first conductive material of the first wirings.

6. The method according to claim 1, wherein the plurality of first wirings consists essentially of gold.

7. The method according to claim 1, wherein the second wiring connects the transistor to another transistor.

8. The method according to claim 1,
wherein the plurality of first wirings includes an interdigital pattern, and
wherein the active layer is formed on the interdigital pattern.

9. The method according to claim 1,
wherein the plurality of first wirings includes a grid pattern, and
wherein the second wiring is formed on the grid pattern.

10. The method according to claim 1,
wherein the plurality of first wirings includes an interdigital pattern and a grid pattern,
wherein the active layer is formed on the interdigital pattern, and
wherein the second wiring is formed on the grid pattern.

11. A method for making a wiring board, comprising:
a step of applying a first conductive material on at least a protruding feature of a first mold that has protruding and recessed features;
a step of forming a plurality of first wirings as electrodes of a transistor by pressing the first mold against an adhesive surface of a substrate so as to transfer the first conductive material on the protruding feature onto the adhesive surface of the substrate, with the plurality of first wirings having a penetrating hole;

a step of forming an active layer of the transistor by applying an organic semiconductor on the plurality of first wirings; and a step of forming a second wiring by applying a second conductive material on the plurality of first wirings such that the second conductive material (i) contacts a surface of the first wiring, (ii) contacts a first portion of the adhesive surface within the penetrating hole, and (iii) contacts a second portion of the adhesive surface outside of the penetrating hole, wherein the substrate includes an adhesive layer whose surface is the adhesive surface, wherein the adhesive layer consists essentially of poly-2-vinylnaphthalene, and wherein the active layer and the adhesive layer contact each other between the plurality of first wirings.

12. The method according to claim 11, wherein the step of forming the second wiring includes:
applying the second conductive material on a protruding feature of a second mold having protruding and recessed features; and
pressing the second mold against the substrate so as to transfer the second conductive material onto the surface of the first wiring, the first portion, and the second portion.

13. The method according to claim 11, wherein the step of forming the second wiring is carried out by any one of an ink jet printing process, a screen printing process, and an offset printing process.

14. The method according to claim 11, wherein the first wirings are transferred onto the substrate by a nanoimprinting process or a soft lithographic process.

15. The method according to claim 11, wherein the first portion is surrounded by the first conductive material of the first wirings.

* * * * *